(12) United States Patent
Coleman et al.

(10) Patent No.: US 7,480,146 B2
(45) Date of Patent: Jan. 20, 2009

(54) HEAT SINK MOUNTING SYSTEMS AND METHODS

(75) Inventors: Richard A. Coleman, Austin, TX (US); Steven M. Christensen, Leander, TX (US); John R. Pugley, Round Rock, TX (US)

(73) Assignee: Newisys, Inc., Austin, TX (US)

( * ) Notice: Subject to any disclaimer, the term of this patent is extended or adjusted under 35 U.S.C. 154(b) by 0 days.

(21) Appl. No.: 11/691,100

(22) Filed: Mar. 26, 2007

(65) Prior Publication Data

US 2008/0239677 A1 Oct. 2, 2008

(51) Int. Cl.
*H05K 7/20* (2006.01)
*F28F 7/00* (2006.01)
*H01L 23/34* (2006.01)

(52) U.S. Cl. .................. 361/719; 165/80.3; 165/185; 257/719

(58) Field of Classification Search ......... 257/718–719; 361/719
See application file for complete search history.

(56) References Cited

U.S. PATENT DOCUMENTS

| | | | |
|---|---|---|---|
| 4,157,583 A | 6/1979 | Basmajian et al. | |
| 5,031,028 A | 7/1991 | Galich et al. | |
| 5,526,874 A | 6/1996 | White | |
| 5,638,258 A | 6/1997 | Lin | |
| 5,959,350 A | 9/1999 | Lee et al. | |
| 6,012,510 A | 1/2000 | Cook | |
| 6,061,239 A | 5/2000 | Blomquist | |
| 6,111,752 A | 8/2000 | Huang et al. | |
| 6,137,298 A * | 10/2000 | Binns ..................... 324/755 | |
| 6,278,615 B1 | 8/2001 | Brezina et al. | |
| 6,343,015 B1 | 1/2002 | Huang et al. | |
| 6,473,306 B2 | 10/2002 | Koseki et al. | |
| 6,480,384 B2 | 11/2002 | Lo | |
| 6,492,202 B1 | 12/2002 | Lober et al. | |
| 6,542,367 B2 | 4/2003 | Shia et al. | |
| 6,600,650 B1 | 7/2003 | Lee | |
| 6,634,890 B2 | 10/2003 | Peterson et al. | |
| 6,639,800 B1 | 10/2003 | Eyman et al. | |
| 6,648,664 B1 | 11/2003 | McHugh et al. | |
| 6,731,504 B1 | 5/2004 | Liu | |
| 6,741,089 B2 | 5/2004 | Conroy | |
| 6,746,270 B2 | 6/2004 | Peterson et al. | |
| 6,752,636 B2 | 6/2004 | Ma | |
| 6,758,692 B2 | 7/2004 | Walkup et al. | |
| 6,771,506 B2 | 8/2004 | Lee et al. | |
| 6,778,395 B1 | 8/2004 | Dong et al. | |

(Continued)

*Primary Examiner*—Gregory D Thompson
(74) *Attorney, Agent, or Firm*—Law Office of Andrei D. Popovici, P.C.

(57) ABSTRACT

In some embodiments, a heat sink is pressed down on a heat source such as an integrated circuit by rotating a cam to press down a set of springs over a loading arm, which is in turn positioned over a heat sink base. A cam shaft is placed in a hinge opening of a mounting frame secured to a printed circuit board (PCB). The mounting frame encloses a heat sink positioned over an IC. The hinge opening defines a hinge axis parallel to the PCB plane. A loading arm includes spring wells for holding coil springs, which are compressed between the mounting frame and the bottoms of the spring wells when the cam is rotated. The mounting frame and loading arm may include mating, self-locking sections including hinge protrusions having cross-sections shaped as a circle sectioned linearly off-center.

16 Claims, 8 Drawing Sheets

U.S. PATENT DOCUMENTS

| | | |
|---|---|---|
| 6,898,083 B1 | 5/2005 | Hornung |
| 6,906,923 B2 | 6/2005 | Lofland et al. |
| 6,924,982 B2 | 8/2005 | Chen et al. |
| 6,947,283 B2 | 9/2005 | Hsieh et al. |
| 6,987,672 B2 | 1/2006 | Franz et al. |
| 6,988,871 B2 | 1/2006 | Deboer et al. |
| 7,017,653 B2 | 3/2006 | Lotter et al. |
| 7,038,914 B2 | 5/2006 | Heirich et al. |
| 7,072,183 B2 | 7/2006 | Lee et al. |
| 7,075,790 B2 | 7/2006 | Chen et al. |
| 7,099,156 B2 | 8/2006 | Chen et al. |
| 2003/0048610 A1 | 3/2003 | Herring et al. |
| 2003/0117777 A1 | 6/2003 | Franz et al. |
| 2004/0062007 A1 | 4/2004 | Hsieh et al. |
| 2004/0125566 A1 | 7/2004 | Lee et al. |
| 2004/0231826 A1 | 11/2004 | Armstrong et al. |
| 2005/0045311 A1 | 3/2005 | Chen et al. |
| 2005/0083659 A1 | 4/2005 | Gattuso et al. |
| 2005/0111191 A1 | 5/2005 | Lee et al. |
| 2005/0181656 A1 | 8/2005 | Hayakawa et al. |
| 2005/0237720 A1 | 10/2005 | Li et al. |
| 2007/0268672 A1* | 11/2007 | Barsun et al. ............... 361/710 |
| 2008/0101033 A1* | 5/2008 | Cromwell et al. ........... 361/719 |

* cited by examiner

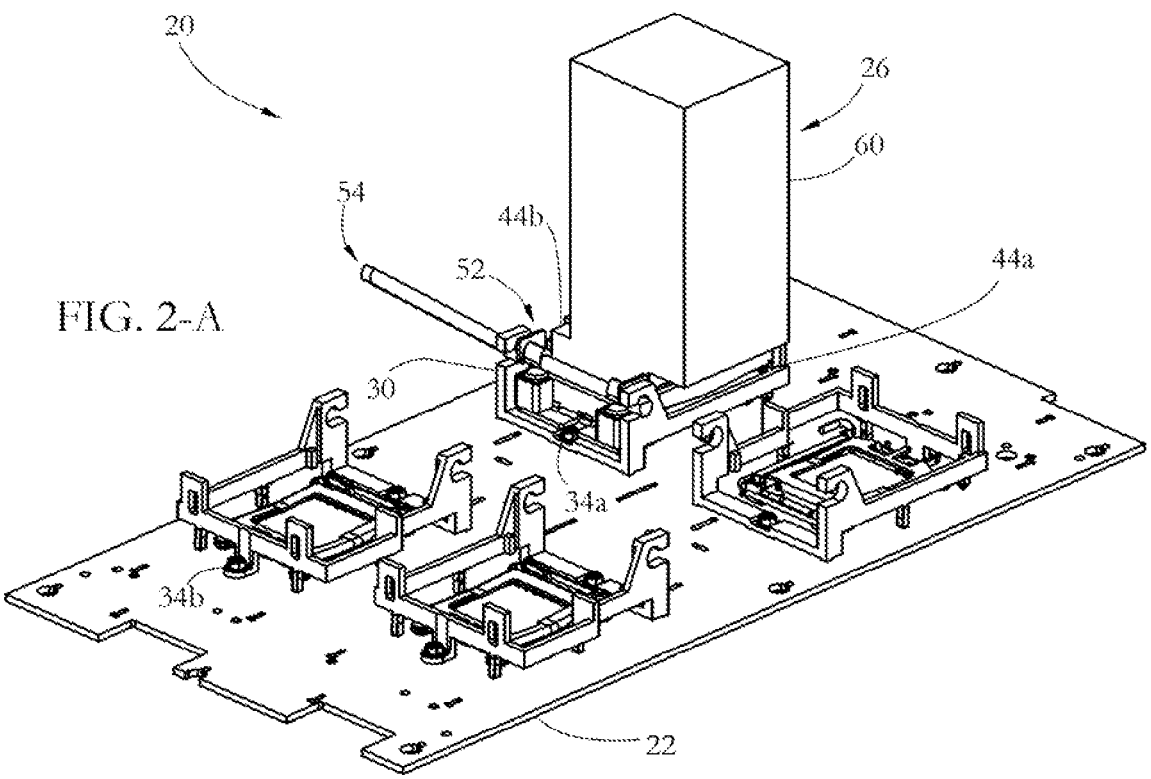
FIG. 2-A
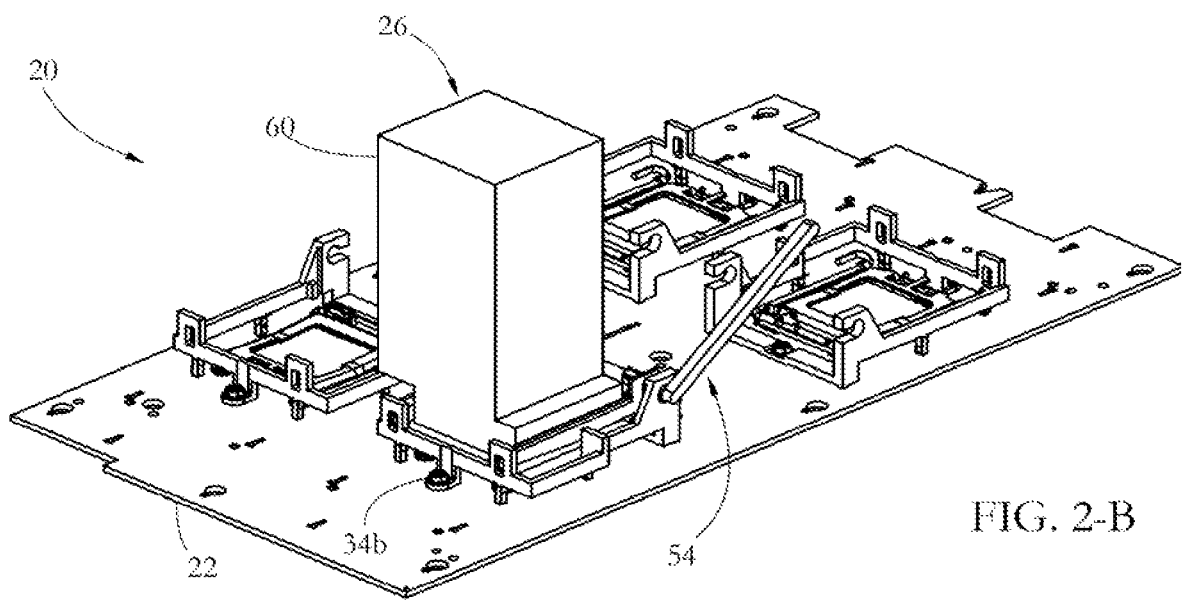
FIG. 2-B

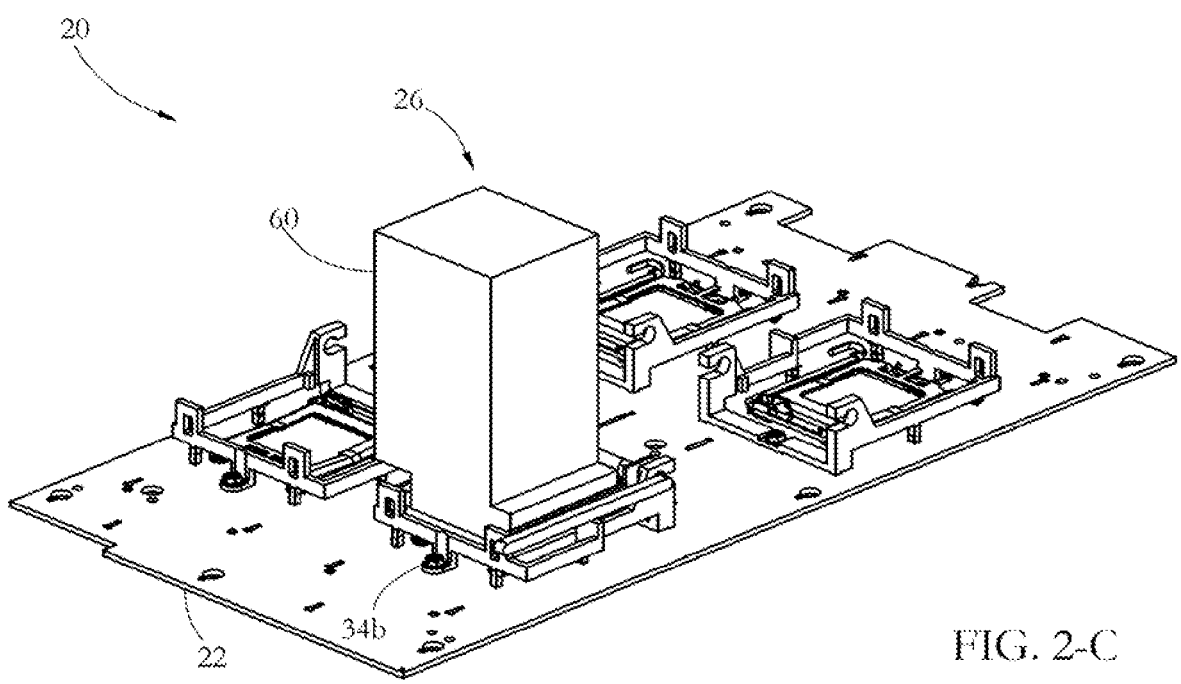
FIG. 2-C

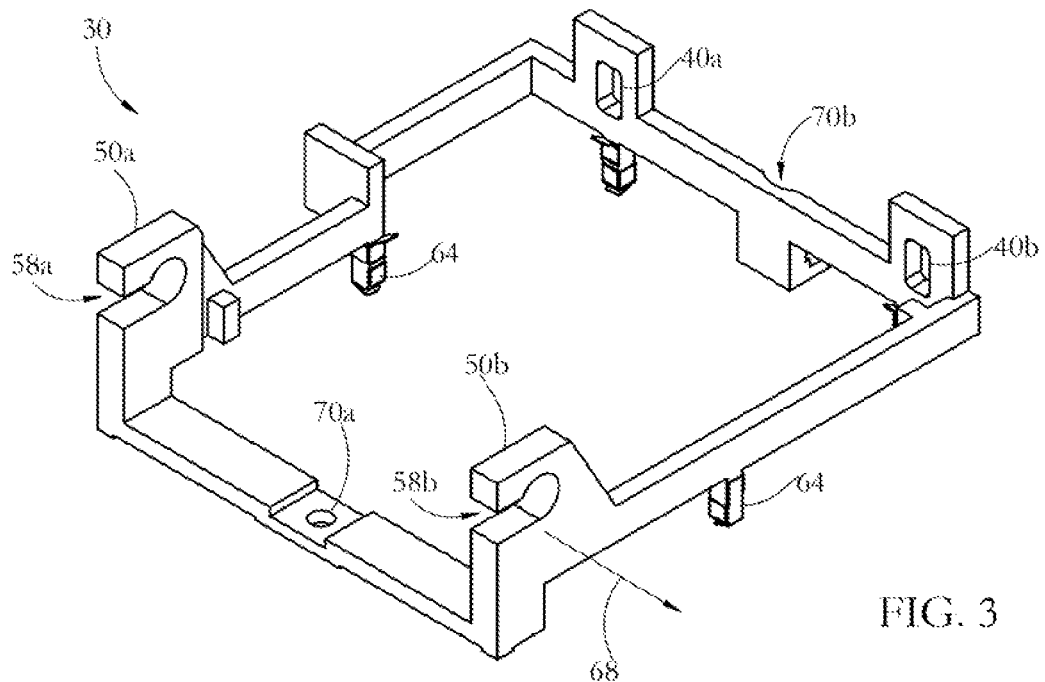
FIG. 3
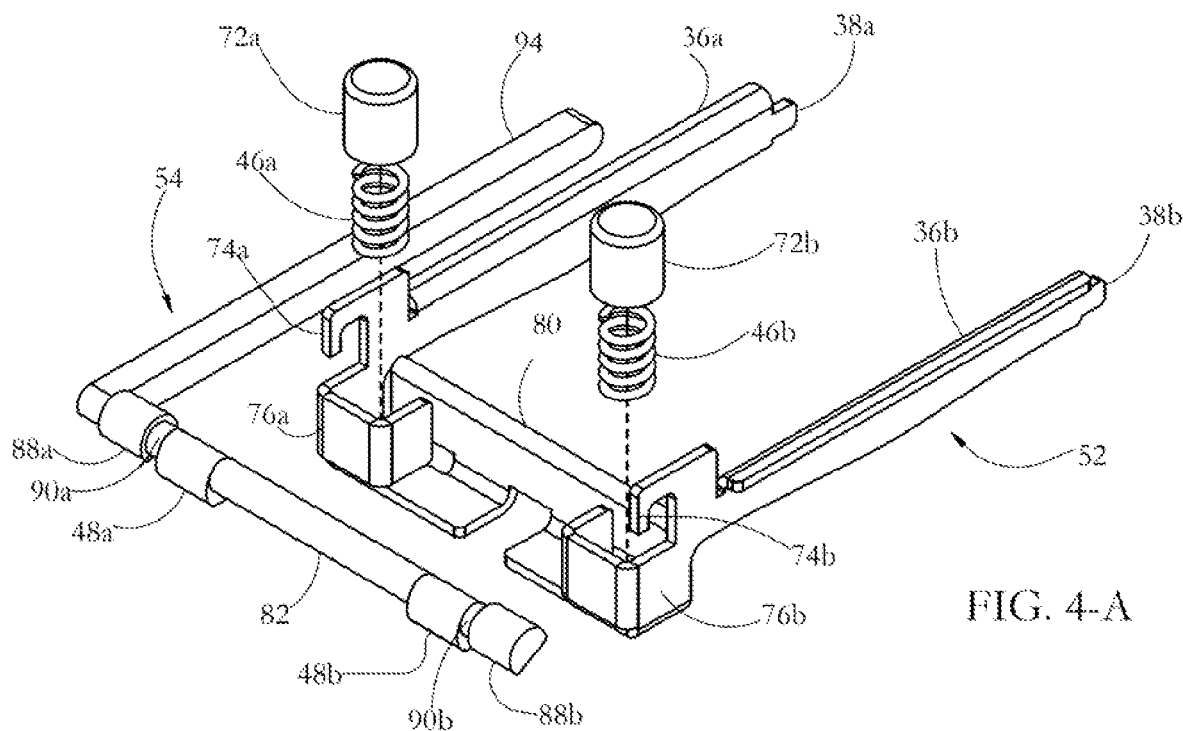
FIG. 4-A

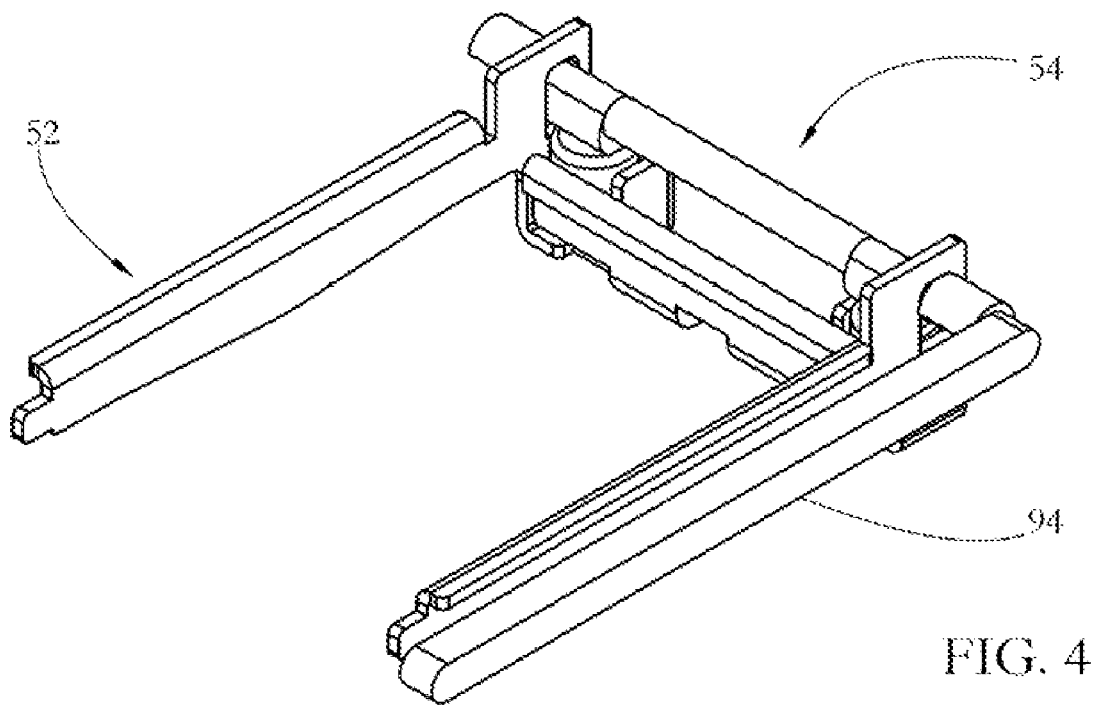
FIG. 4-B
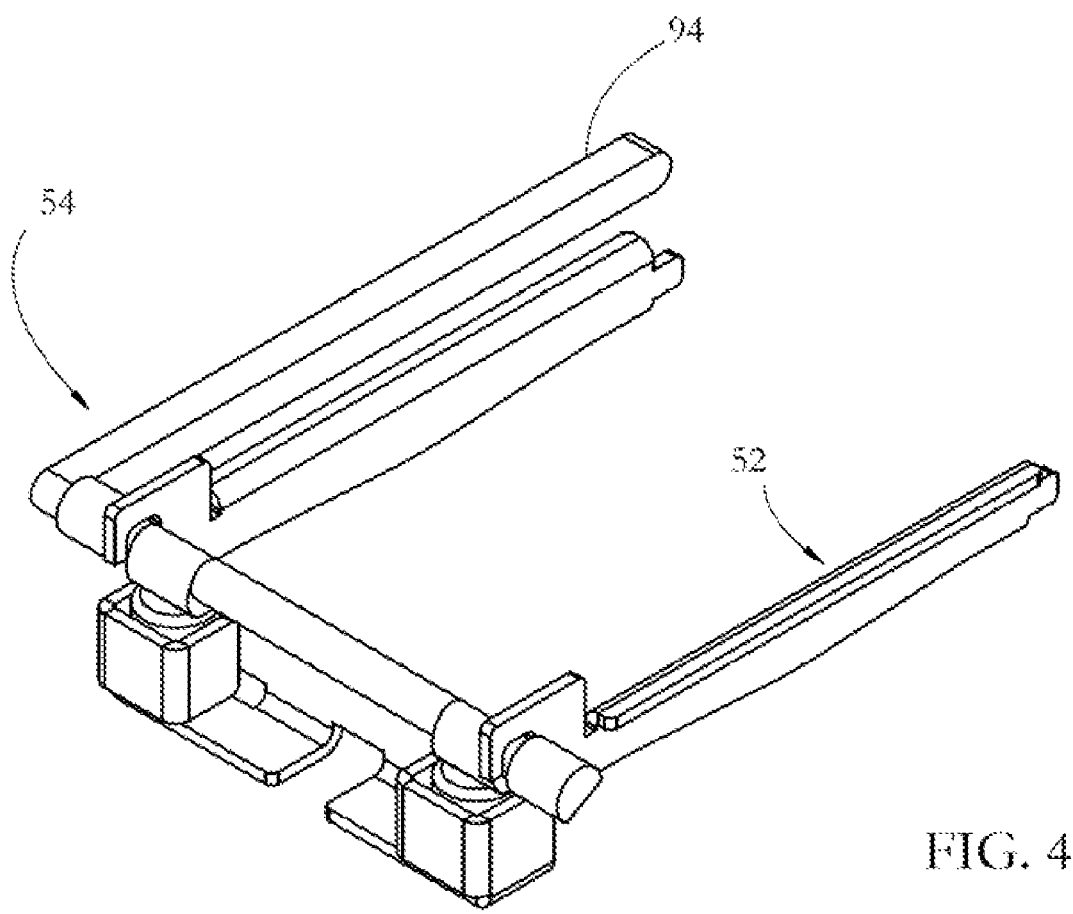
FIG. 4-C

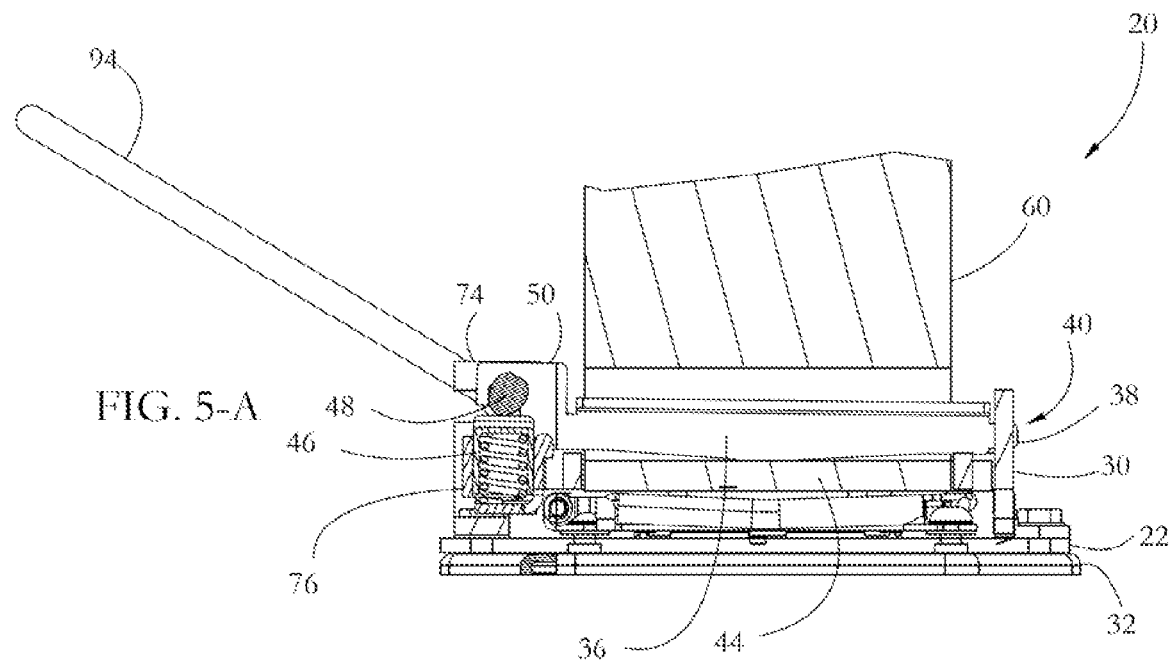
FIG. 5-A
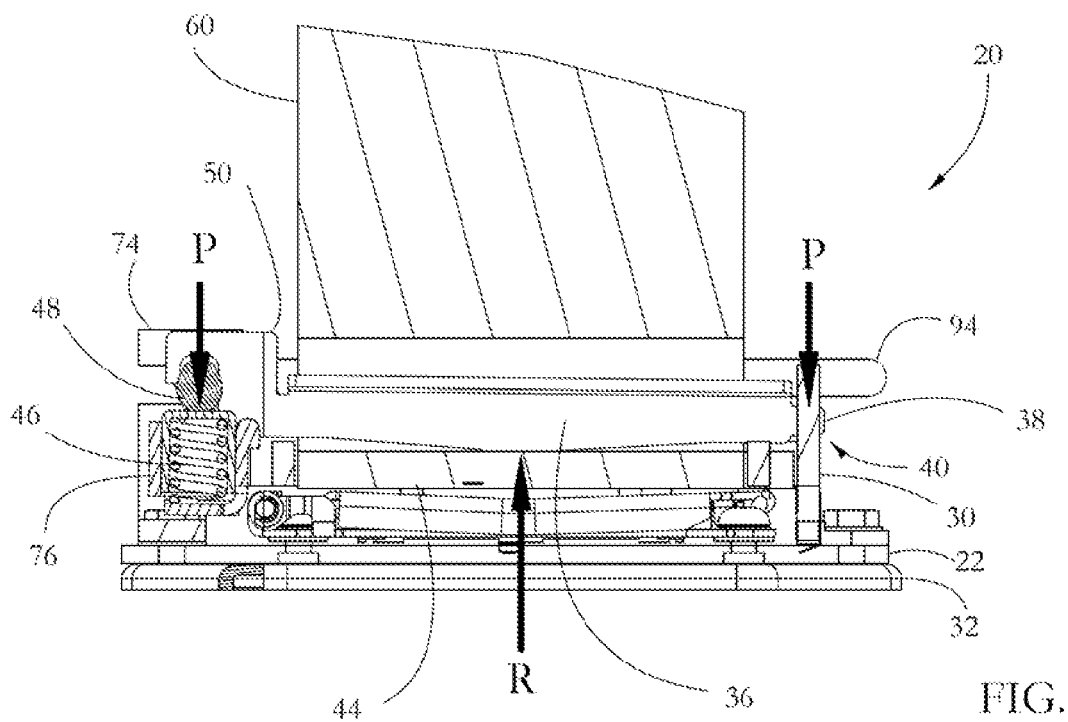
FIG. 5-B

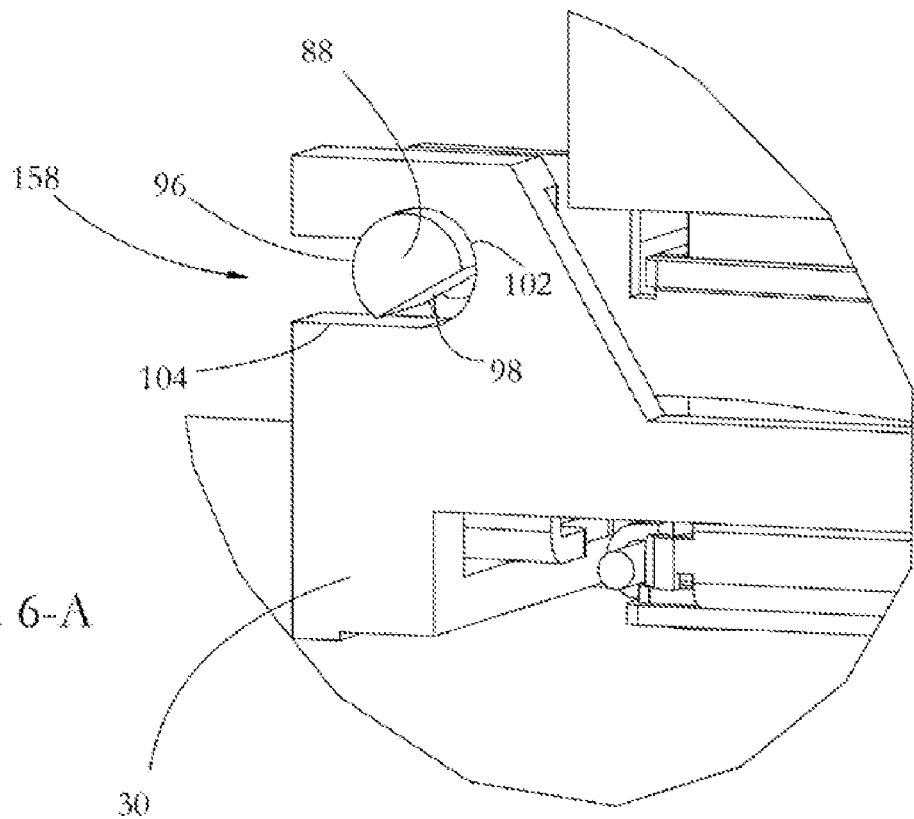
FIG. 6-A
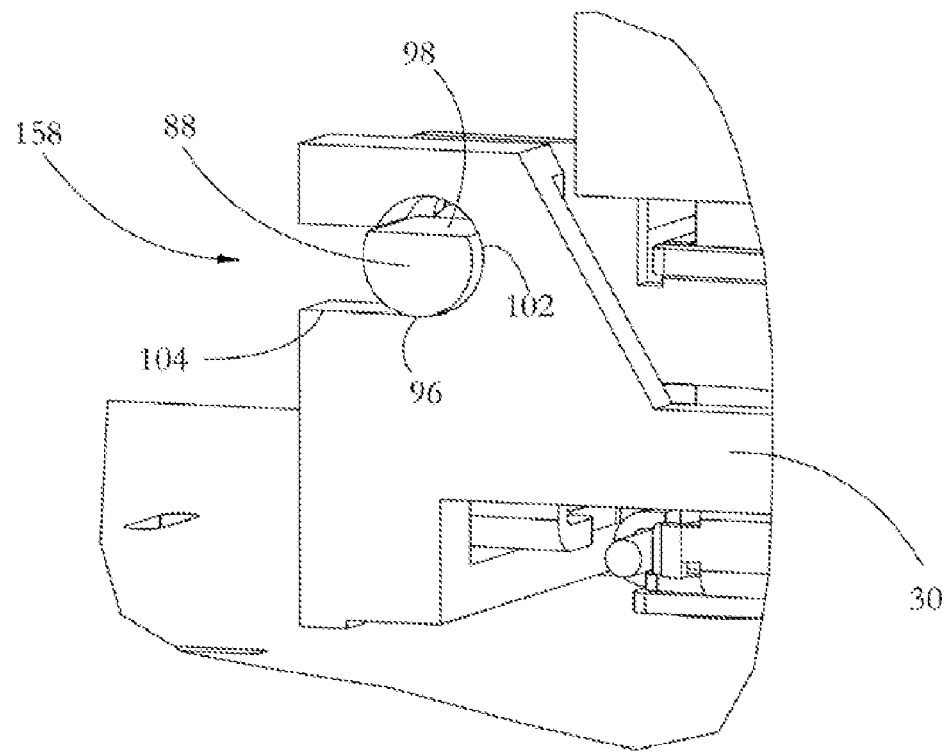
FIG. 6-B

HEAT SINK MOUNTING SYSTEMS AND METHODS

BACKGROUND

The invention relates to systems and methods for cooling integrated circuits such as microprocessors.

The power consumption of microprocessors and other integrated circuits (IC) used in the electronics industry has been steadily increasing. Much of the electrical power used by such circuits is dissipated in the form of heat. Overheating may affect the performance of an integrated circuit and possible cause damage to the circuit. A common method of cooling integrated circuits involves heat sinks, which transfer heat between the circuit and the surrounding environment.

The quality of the physical contact between an integrated circuit and its heat sink affects the efficiency of heat transfer. Contact may be improved by placing a layer of thermal interface material (TIM) between the heat sink and the integrated circuit, and by effectively pressing the heat sink against the IC.

Some attachment designs require the use of a tool to perform the attachment of the heat sink to the IC. Requiring the use of a tool may add complexity to the system assembly process. At the same time, designers and manufactures may want to control the load applied between the heat sink and processors to a predefined range of values. Applying an excessively high load may cause damage to the underlying structures. A low applied load may lead to suboptimal heat transfer to the heat sink during the operation of the IC, and possibly to detachment of the heat sink from the IC during shock and vibration testing. In addition, as the power of ICs increases, system designers may wish to use increasingly large heat sinks and associated loads. Some heat sink attachment designs, such as some designs using flexible clips, may not be able to adequately secure relatively large heat sinks.

SUMMARY

According to one aspect, an apparatus for attaching a heat sink to an integrated circuit comprises a fixed mounting frame rigidly coupled to a printed circuit board supporting the integrated circuit, a loading arm positioned over the heat sink; a set of springs coupled to the loading arm; and a cam coupled to the mounting frame, loading arm and the set of springs. The cam is rotatable between an open position and a closed position. Rotating the cam from the open position to the closed position compresses the set of springs between the mounting frame and the loading arm to press the loading arm onto the heat sink and press the heat sink onto the integrated circuit.

According to another aspect, a method of attaching a heat sink to an integrated circuit comprises rigidly coupling a fixed mounting frame to a printed circuit board supporting the integrated circuit, placing the heat sink over the integrated circuit, placing a loading arm over the heat sink, placing a set of springs over the loading arm, and rotating a cam from an open position to a closed position to compress the set of springs between the mounting frame and the loading arm to press the loading arm onto the heat sink and press the heat sink onto the integrated circuit.

BRIEF DESCRIPTION OF THE DRAWINGS

The foregoing aspects and advantages of the present invention will become better understood upon reading the following detailed description and upon reference to the drawings where:

FIGS. 2A-B show an isometric view of a heat sink assembly in fully assembled state with the cam in an open position, according to some embodiments of the present invention.

FIG. 2-C shows the heat sink assembly of 2-A-B with the cam in a closed position, according to some embodiments of the present invention.

FIG. 3 shows an exemplary mounting frame according to some embodiments of the present invention.

FIG. 4-A shows an exploded view of a mounting assembly including a loading arm, can shaft and cam lever according to some embodiments of the present invention.

FIGS. 4-B-C show the mounting assembly of FIG. 4-A with the cam in a closed position, according to some embodiments of the present invention.

FIGS. 5-A-B show side views of a mounting assembly with the cam in open and closed positions, respectively, according to some embodiments of the present invention.

FIGS. 6-A-B show a detailed view of a mounting frame hinge and a self-locking section of a cam shaft with the cam in open and closed positions, respectively, according to some embodiments of the present invention.

DETAILED DESCRIPTION OF PREFERRED EMBODIMENTS

In the following description, it is understood that all recited connections between structures can be direct operative connections or indirect operative connections through intermediary structures. A set of elements includes one or more elements. Any recitation of an element is understood to refer to at least one element. Each recited element or structure can be formed by or be part of a monolithic structure, or be formed from multiple distinct structures. For example, a cam forming part of a cam shaft may be monolithically (integrally) formed with the rest of the cam shaft, or may be assembled/affixed to a rotating cylindrical shaft. Unless otherwise specified, a statement that a first structure is positioned on, above, or below a second structure, or that a first structure presses on a second structure, encompasses a first structure positioned directly (immediately) on, above, or below the second structure, or pressing directly on the second structure, as well as a first structure separated from the second structure by one or more intermediary structures. For example, a heat sink positioned on or above an integrated circuit may be separated from the integrated circuit by a heat-transfer layer or other structures. Unless otherwise required, any described method steps need not be necessarily performed in a particular illustrated order. All recitations of positions or directions (e.g. above, below, over, under, up down) are understood to refer to relative positions/directions, and not necessarily positions/directions with reference to the direction of gravity.

The following description illustrates embodiments of the invention by way of example and not necessarily by way of limitation.

Figure 1:
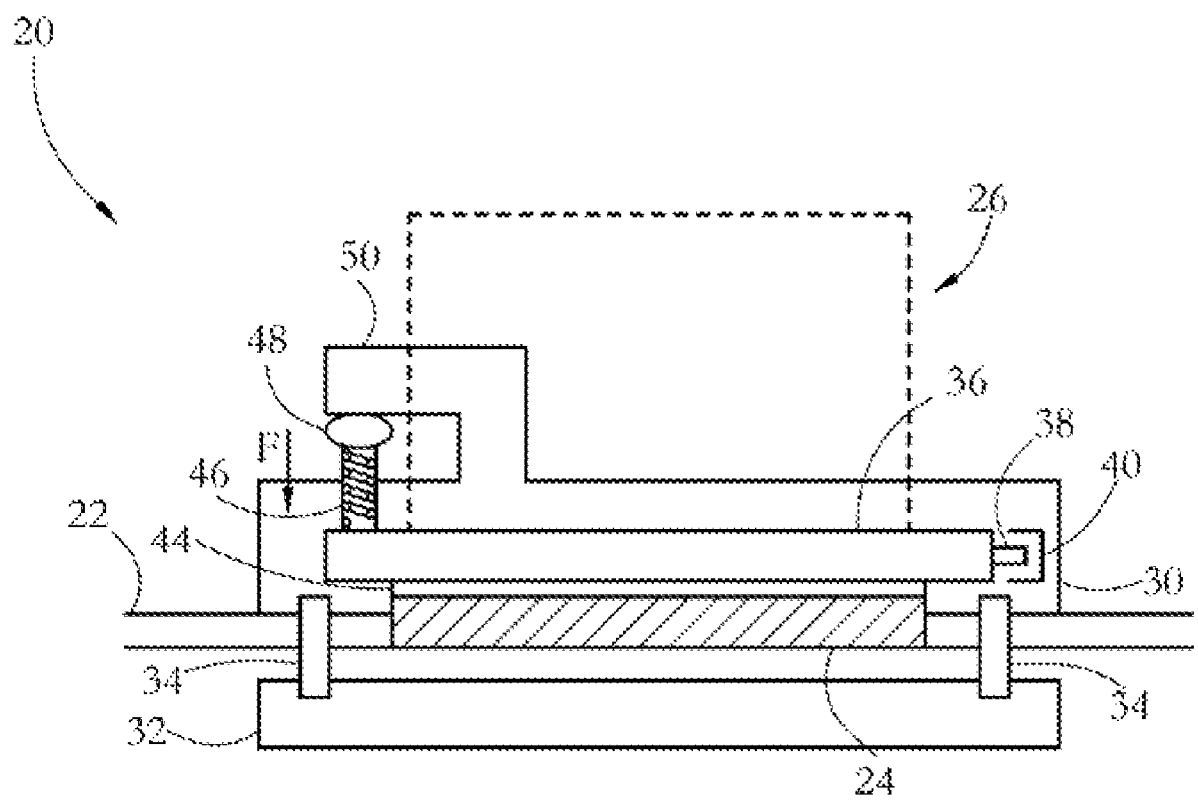
FIG. 1 shows a side view of an exemplary apparatus for attaching a heat sink to an integrated circuit according to some embodiments of the present invention.

FIG. 1 shows a side view of an exemplary heat sink assembly 20 according to some embodiments of the present invention. Assembly 20 includes a generally planar printed circuit board (PCB) 22, a heat source such as an integrated circuit (IC) 24 mounted on PCB 22, a heat sink 26 mounted on IC 24, and a number of components used to secure heat sink 26 to IC 24. For clarity, only one IC is shown in FIG. 1. Assembly 20 may include multiple ICs and associated heat sink components mounted on PCB 22. A heat sink mounting frame 30 is rigidly coupled to PCB 22.

Mounting frame 30 is attached to a rigid support plate 32 positioned underneath PCB 22 (i.e. on the side of PCB 22 opposite mounting frame 30) through a plurality of fasteners (e.g. screws) 34 that run through PCB 22. In some embodiments, the shape and size of the mounting frame 30 are chosen to align heat sink 26 with IC 24 and to laterally support heat sink 26. Heat sink 26 has a flat bottom surface designed to come in close contact with the exposed side of IC 24. In some embodiments, to maximize the rate of heat transfer, a layer of thermal interface material (TIM) is sandwiched between heat sink 26 and IC 24. A base 44 of heat sink 22 protrudes laterally (out of the plane of the paper in FIG. 1), forming a shoulder shaped to support a loading beam described below.

A loading beam 36 is positioned over laterally protruding base 44. Loading beam 36 includes a pivot tab 38 which fits in a matching pivot aperture 40 defined in mounting frame 30. A spring 46 is positioned over an end of loading beam 36 situated opposite pivot tab 38. Spring 46 is pressed between loading beam 36 and a cam 48. Cam 48 forms part of a cam shaft whose vertical movement is constrained by mounting frame 30. In particular, the lower surface of a hinge protrusion 50 of mounting frame 30 presses down on the cam shaft. Hinge protrusion 50 may form part of a hinge structure described below. Rotating the cam from an open position (shown in FIG. 1) to a closed position compresses spring 46 between mounting frame 30 and loading beam 36. Spring 46 presses loading beam 36 onto heat sink 26, thus pressing heat sink 26 onto IC 24.

FIGS. 2-A-B show isometric views of a heat sink assembly 20 in an assembled state with the cam in an open position. FIG. 2-C shows heat sink assembly 20 with the cam in a closed position. Heat sink 26 includes a heat sink body 60 and a laterally-protruding base including a pair of lateral extensions 44a-b situated on opposite lateral sides of heat sink body 60. Mounting frame 30 extends generally around a perimeter of IC 24 and heat sink body 26. A pair of screws 34a-b fit through corresponding apertures defined in mounting frame 30 and in a support plate situated underneath PCB 22, thus securing mounting frame 30 to PCB 22. A loading arm 52 and cam lever assembly 54 are used to secure heat sink 26 to IC 24 as described in detail below.

FIG. 3 shows an isometric view of mounting frame 30 according to some embodiments of the present invention. Mounting frame 30 includes a pair of pivot apertures 40a-b along its back side, and a corresponding pair of hinge structures 58a-b including hinge protrusions 50a-b, respectively. Pivot apertures 40a-b are sized to receive corresponding pivot tabs 38 of loading arm 52. Each hinge-structure 58a-b defines a corresponding U-shaped hinge opening facing the front side of mounting frame 30. The hinge openings are sized to receive the outer ends of a cam shaft of cam lever assembly 54. Hinge structures 58a-b define a hinge axis 68 substantially parallel to the plane of PCB 22 (FIG. 2-A-C). A pair of apertures 70a-b are sized to receive the screws 34a-b shown in FIG. 2-A-B-C to secure mounting frame 30 to PCB 22. In some embodiments, mounting frame 30 is constructed of an electrically-conductive material such as a metal. A plurality of grounding clips 64 extend downward from mounting frame 30, and provide an electrical connection between mounting frame 30 and a ground plane of PCB 22. In some embodiments, grounding clips 64 mate with matching holes in PCB 22.

FIG 4-A shows an exploded view of loading arm 52, cam lever assembly 54, and a set of compression coil springs 46a-b and associated spring caps 72a-b. FIGS. 4-B-C show loading arm 52 and cam lever assembly 54 for a closed cam position according to some embodiments of the present invention. As shown in FIG. 4-A, loading arm 52 includes a pair of parallel loading beams 36a-b connected at their front ends by a transverse beam-coupling member 80. Beam-coupling member 80 is situated opposite pivot tabs 38a-b. Beam-coupling member 80 includes two spring wells 76a-b for laterally confining springs 46a-b, respectively, and a pair of downward-facing hinges 74a-b for constraining a motion of cam lever assembly 54. The hinge axis of hinges 74a-b coincides with that of hinges 58a-b (FIG. 3). Spring wells 76a-b include well bottoms for supporting springs 46a-b. Two spring caps 72a-b are positioned over springs 46a-b, respectively.

Cam lever assembly 54 includes a cam shaft 82 and a cam lever 94 rigidly coupled to cam shaft 82. Cam shaft 82 includes a pair of cams 48a-b spaced to fill over springs 46a-b. Cam shaft 82 further includes loading-arm hinge regions 90a-b sized to fit hinges 74a-b, and a pair of self-locking mounting frame hinge sections 88a-b spaced to fit within hinges 58a-b (FIG. 3). Cam lever 94 allows a user to rotate cams 48a-b between open and closed positions.

The operation and assembly of loading arm 52 and cam lever assembly 54 may be better understood by considering FIGS. 5-A-B. FIGS. 5-A-B show side views of heat sink assembly 20 with the cam in open and closed positions, respectively, according to some embodiments of the present invention.

During assembly, mounting frame 30 is attached to support plate 32 and thus secured to PCB 22. Heat sink 26 is lowered into the internal space defined within mounting frame 30, placing the base of the heat sink 26 in contact with the exposed surface of the IC. Springs 46 and spring caps 72 are installed in spring wells 76. Loading arm 52 is mounted onto mounting frame 30, with pivot tabs 38 inserted in pivot apertures 40, and loading beams 36 placed onto heat sink base 44. When mounting frame 30 and loading arm 52 are aligned, mounting frame 30 and loading arm 52 form a common hinge that accommodates sections of cam shaft 82. Springs 46 are situated below cams 48.

To press heat sink 26 against the IC, cam lever 94 is rotated approximately 150 degrees to a closed position, in which cam lever 94 is parallel to PCB 22, as shown in FIG. 5-B. Cam shaft 82 rotates within the hinge defined by mounting frame 30, and forces cams 48 to bear against spring caps 72, compressing springs 46. When compressed, springs 46 push against the bottom of spring wells 76, thus pushing loading beams 36 onto heat sink base 44. By pivoting within pivot apertures 40, loading beams 36 act like levers, pressing heat sink 26 against the IC.

When cam lever 94 is rotated from the open to the closed position, cams 48 compress springs 46 a distance of x. The reaction force caused by each spring 46 is $P=r \cdot x$, where r is the spring rate. The force P is transferred to heat sink 26 by the levering action of loading beams 36. If the resultant force R on the heat sink 26 is considered to be applied halfway between the two ends of loading beams 36, and loading beams 36 are rigid, then each loading beam 36 exerts a force $R=2P$ on the heat sink. The total load on the IC depends on the number of springs 46 and loading beams 36. For example, in an embodiment with two identical loading beams 36 and two identical springs 46, the total load between heat sink 26 and the IC is 2R, or 4P. Illustratively, if the required load between the heat sink 26 and the IC is 75 lbs, each spring 46 would provide a force of (75 lbs/2)/2, or 18.75 lbs at the given deflection x provided by cam 48.

In some embodiments, mounting frame 30 and cam lever assembly 54 include matching self-locking structures. FIGS. 6-A-B show a detailed view of a mounting frame hinge opening 158 and a self-locking end section 88 of a cam shaft with the cam in closed and open positions, respectively, according to some embodiments of the present invention. Hinge opening 158 is shaped so that when the cam shaft is rotated into the closed position, the cam shaft self-locks into mounting frame 30. Self-locking end section 88 has a cross-section shaped as a circle sectioned linearly off-center. End section 88 includes a flat surface 98 and a cylindrical surface 96. Hinge opening 158 includes an inner channel 102 having a circular cross-section matching the radium of end section 88, and an access path 104 sized to accommodate end section 88 when flat surface 98 faces upward. When the cam shaft is in the open position, flat surface 98 fits through access path 104, so that end section 88 can be removed through access path 104. When the cam shaft is in the closed position, cylindrical surface 96 is pressed onto and mates with the inner channel 102 and section 88 no longer fits through access path 104, and consequently cannot be removed from hinge opening 158.

Figure 7:
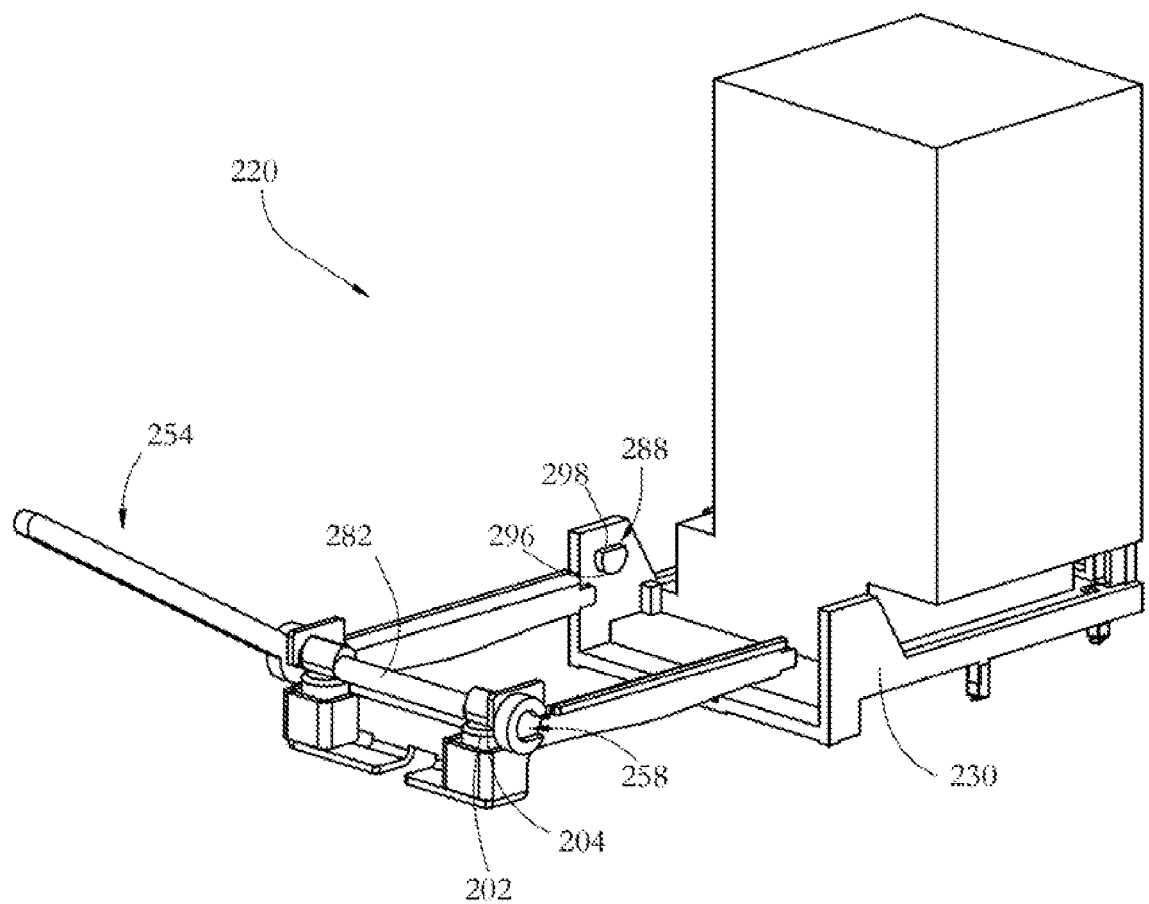
FIG. 7 shows a mounting assembly having a cam shaft defining a pair of hinge openings, according to some embodiments of the present invention.

FIG. 7 shows a heat sink mounting assembly 220 having a cam shaft 282 defining a pair of laterally-disposed hinge openings 258, according to some embodiments of the present invention. A mounting frame 230 includes a pair of self-locking hinge protrusions 288 sized to fit into hinge openings 258 to self-lock a cam lever assembly 254 to mounting frame 230. Each hinge protrusion 288 includes a flat upward-facing surface 298, and a cylindrical lower surface 296. In a plane perpendicular to the hinge axis, each hinge protrusion has a cross-section shaped as a circle sectioned linearly off-center. Each hinge opening includes an inner channel 202 having a circular cross-section matching the radius of a corresponding hinge protrusion 288, and an access path 204 sized to accommodate hinge protrusion 288 when cam shaft 282 is in an open position, with access path facing the front side of mounting frame 30.

The exemplary systems and methods described above allow a heat sink to be rigidly attached to an integrated circuit, and additionally, a controlled amount of loading to be applied between the heat sink and the IC.

The following description is intended to illustrate aspects of particular implementations of embodiments of the present invention, and is not intended to limit the scope of the present invention. Employing a spring-loaded mounting frame/cam assembly as described above provides a tool-less, convenient way of securing heat sinks to integrated circuits with relatively high controlled loads. As the power consumed by IC's goes up, the physical size and weight of heat sinks capable of efficiently cooling such devices also increase. To ensure that the heat sink does not detach from the IC in case of mechanical shock or vibration, and also to provide an optimal thermal contact between the two components, it may desirable to apply a relatively large load between the heat sink and the IC. In some applications, load values of 60-90 lbs may be useful.

In a preferred embodiment of the present invention, the required load between the heat sink and IC is provided using a combination of springs, levers, and cams. By using springs with various spring rates, the load may be adjusted to meet manufacturers' specifications for a variety of IC's, without altering other aspects of the design. The levering action of the loading arm may increase the force exerted by the springs at least two-fold (depending on the geometry of the loading beams), allowing for potentially large forces to be applied between the heat sink and the IC. The use of a cam ensemble to engage the springs also facilitates the application of large loads, because of the high leverage (e.g. 100 to 1) specific to a cam.

It will be clear to one skilled in the art that the above embodiments may be altered in many ways without departing from the scope of the invention. Accordingly, the scope of the invention should be determined by the following claims and their legal equivalents.

What is claimed is:

1. An apparatus for attaching a heat sink to an integrated circuit, comprising:
   a fixed mounting frame rigidly coupled to a printed circuit board supporting the integrated circuit;
   a loading arm positioned over the heat sink;
   a set of springs coupled to the loading arm; and
   a cam coupled to the mounting frame, loading arm and the set of springs, the cam being rotatable between an open position and a closed position, wherein rotating the cam from the open position to the closed position compresses the set of springs between the mounting frame and the loading arm to press the loading arm onto the heat sink and press the heat sink onto the integrated circuit.

2. The apparatus of claim 1, further comprising a cam lever rigidly coupled to the cam, for rotating the cam between the open position and the closed position.

3. The apparatus of claim 1, wherein the loading arm comprises:
   a pair of parallel beams positioned over the heat sink; and
   a beam-coupling member connecting the pair of beams, the beam-coupling member including a set of spring wells for accommodating the set of springs, wherein each spring presses on a bottom surface of a corresponding spring well when the cam is in the closed position.

4. The apparatus of claim 1, wherein:
   the mounting frame includes a hinge opening defining a hinge axis substantially parallel to a plane of the printed circuit board; and
   a cam shaft including the cam is positioned within the hinge opening and is rotatable about the hinge axis to move the cam between the open position and the closed position, wherein the cam shaft is pressed between the set of springs and a surface of the hinge opening when the cam is in the closed position.

5. The apparatus of claim 4, wherein:
   the cam shaft includes a self-locking section positioned within the hinge opening;
   in a plane perpendicular to the hinge axis, the self-locking section has a cross-section shaped as a circle sectioned linearly off-center,
   when the cam is in the open position, a flat surface of the self-locking section faces a curved surface of the hinge opening to facilitate a removal of the cam shaft from the hinge opening; and
   when the cam is in the closed position, a curved surface of the self-locking section mates with the curved surface of the hinge opening to lock the cam shaft in the hinge opening.

6. The apparatus of claim 1, wherein:
   a cam shaft includes a pair of hinge openings defining a hinge axis substantially parallel to a plane of the printed circuit board, the cam shaft including the cam; and
   the mounting frame includes a pair of hinge protrusions each positioned in a corresponding hinge opening.

7. The apparatus of claim 6, wherein:
   in a plane perpendicular to the hinge axis, each hinge protrusion has a cross-section shaped as a circle sectioned linearly off-center, when the cam is in the open position, a flat surface of each hinge protrusion faces a curved surface of the corresponding hinge opening to facilitate a removal of each hinge protrusion from the corresponding hinge opening; and when the cam is in the closed position, a curved surface of each cam-locking protrusion mates with a curved surface of the corresponding hinge opening to lock each cam-locking protrusion in the corresponding hinge opening.

8. The apparatus of claim 1, wherein the mounting frame comprises:

a hinge opening defining a hinge axis substantially parallel to a plane of the printed circuit board; and a pair of pivot apertures along an end of a base of the mounting frame opposite the hinge opening, for receiving a corresponding pair of pivot tabs of the loading arm, wherein the pivot tabs pivot within the pivot apertures as the cam moves between the open position and the closed position.

9. The apparatus of claim 1, wherein the set of springs includes a coil spring.

10. The apparatus of claim 1, wherein the set of springs includes two coil springs.

11. The apparatus of claim 1, further comprising a set of spring caps each positioned between a corresponding spring and the cam.

12. The apparatus of claim 1, wherein the heat sink and the mounting frame are electrically conductive, and wherein the apparatus further comprises a set of grounding clips connecting the mounting frame to a ground conductor, for grounding the heat sink through the mounting frame.

13. The apparatus of claim 1, wherein the loading arm is positioned over a heat sink base protrusion of the heat sink extending laterally away from a heat sink body of the heat sink.

14. A method of attaching a heat sink to an integrated circuit, comprising:

rigidly coupling a fixed mounting frame to a printed circuit board supporting the integrated circuit;

placing the heat sink over the integrated circuit;

placing a loading arm over the heat sink;

placing a set of springs over the loading arm; and rotating a cam from an open position to a closed position to compress the set of springs between the mounting frame and the loading arm to press the loading arm onto the heat sink and press the heat sink onto the integrated circuit.

15. An apparatus for attaching a heat sink onto an integrated circuit, comprising:

mounting means rigidly coupled to a printed circuit board supporting the integrated circuit, for constraining the heat sink in a plane of the printed circuit board and in a direction perpendicular to the plane of the printed circuit board;

loading means positioned over the heat sink, for coupling a pressing force to the heat sink;

recoil means coupled to the loading means, for coupling the pressing force to the loading means; and a cam coupled to the mounting means, loading means and the recoil means, the cam being rotatable between an open position and a closed position, wherein rotating the cam from the open position to the closed position compresses the recoil means between the mounting frame and the loading means to press the loading means onto the heat sink and press the heat sink onto the integrated circuit.

16. An apparatus comprising:

a printed circuit board;

an integrated circuit mounted on the printed circuit board;

a heat sink positioned onto the integrated circuit;

a fixed mounting frame rigidly coupled to the printed circuit board and enclosing the heat sink;

a loading arm positioned over a laterally-protruding heat sink base of the heat sink;

a set of springs coupled to the loading arm; and a cam coupled to the mounting frame, loading arm and the set of springs, the cam being rotatable between an open position and a closed position, wherein rotating the cam from the open position to the closed position compresses the set of springs between the mounting frame and the loading arm to press the loading arm onto the heat sink base and press the heat sink onto the integrated circuit.

* * * * *